US005563503A

United States Patent [19]
Ng et al.

[11] Patent Number: 5,563,503

[45] Date of Patent: Oct. 8, 1996

[54] SOURCE/SINK CURRENT GENERATING CIRCUIT SYSTEM

[75] Inventors: Solomon K. L. Ng; Gee H. Loh, both of Singapore, Singapore

[73] Assignee: SGS-Thomson Microelectronics Pte Ltd., Singapore, Singapore

[21] Appl. No.: 208,360

[22] Filed: Mar. 8, 1994

[30] Foreign Application Priority Data

Mar. 11, 1993 [GB] United Kingdom .................. 9304954

[51] Int. Cl.[6] ................................ G05F 3/16; H03F 3/04

[52] U.S. Cl. ........................................... 323/315; 330/288

[58] Field of Search .................................... 323/312, 315, 323/316, 317; 330/257, 288, 261, 273, 285, 296; 327/534, 535, 538, 545

[56] References Cited

U.S. PATENT DOCUMENTS

| | | | |
|---|---|---|---|
| 4,119,924 | 10/1978 | Ahmed | 330/288 |
| 4,260,945 | 4/1981 | Ahmed | 323/316 |
| 4,412,186 | 10/1983 | Nagano | 330/288 |
| 4,558,272 | 12/1985 | Grosch | 323/315 |
| 4,879,524 | 11/1989 | Bell | 330/288 |
| 5,446,409 | 8/1995 | Katakura | 323/315 |

FOREIGN PATENT DOCUMENTS 2212633 7/1989 United Kingdom .

*Primary Examiner*—Matthew V. Nguyen
*Attorney, Agent, or Firm*—Robert Groover; Betty Formby

[57] ABSTRACT

A source/sink current generating circuit is arranged to generate source and sink currents which are matched and insensitive to fan out. This is achieved by using a biasing transistor (Q13) between first and second current mirrors which generate respectively the source and sink currents.

5 Claims, 8 Drawing Sheets

SOURCE/SINK CURRENT GENERATING CIRCUIT SYSTEM

FIELD OF THE INVENTION

This invention relates to a reference current generating circuit, capable of providing matched current source and current sink reference currents.

BACKGROUND TO THE INVENTION

Current generating circuits are well known in the art and in their simplest form consist of a pair of matched current mirror transistors, each having a controllable path and a control node for controlling conduction of the controllable path. In bipolar technology, the control node is the base and the controllable path is from collector to emitter. In MOS technology, the control node is the gate and the controllable path is the source/drain channel. The present invention is concerned particularly but not exclusively with bipolar technology. One of the transistors has a current setting resistor connected in its controllable path and has its control node connected to the control node of one transistor and also into its own controllable path. When a current flows through the current setting resistor, the same current is caused to flow in the controllable path of the other transistor and can be used to drive a suitable output transistor to generate a source reference current related to that current through the area ratio of the output transistor and the current mirror transistors. Another pair of matched current mirror transistors is connected in series with the first pair between a supply voltage and ground and drives an output transistor to generate a sink reference current. In practical terms, the basic current mirror circuit has many limitations. One of these is that its impedance is too low for it to act as a perfect current source or sink when connected to other circuitry. To increase the impedance, it is common to include a pair of matched cascode transistors connected respectively to each current mirror transistor for each of source and sink current generating parts.

FIGS. 1A and 1B illustrate a source/sink current generating circuit of this type. The circuit comprises a first current mirror circuit for generating a source current and a second current mirror circuit for generating a sink current. The first current mirror circuit comprises a first set of matched p-n-p bipolar transistors Q1,Q2. These transistors have their emitters connected to a supply voltage Vdd and their bases connected to each other. In conventional current mirror fashion, the base of the second transistor Q2 is connected to its collector. A second set of similarly connected transistors Q3,Q4 is connected in cascode to the first set. A second current mirror circuit comprises a third set of matched n-p-n transistors Q5,Q6 connected in current mirror fashion. The collectors of these transistors Q5,Q6 are connected to the emitters of the transistors Q3,Q4 respectively. The second current mirror circuit also comprises a fourth set of transistors Q7,Q8 connected in cascode with the third set Q5,Q6. There is a set of output transistors Q9,Q10 connected to the first current mirror circuit and a set of output transistors Q11,Q12 connected to the second current mirror circuit. As is known, the collector current Isource through the output transistors Q9,Q10 is related to the collector current through the transistors Q2 and Q4. Likewise, the current Isink through the output transistors Q11,Q12 is related to the collector current through the transistors Q6,Q8. This collector current is set by a current setting resistor R connected to the emitter of the transistor Q8. The sink and source currents Isink, Isource are thus both related to the collector current set by the resistor R. Thus, provided that the sizes of the current mirror transistors in the first and second current mirror circuits are substantially the same, the sink and source currents are substantially matched.

However, the circuit of FIGS. 1A and 1B unsatisfactory in some circumstances. In particular, if a particular manufacturing process has significant process variations affecting the transistors, the currents Isink and Isource will no longer be properly matched. This is due in part to the fact that process variations will affect p-n-p type transistors in a manner differently to n-p-n transistors, thus affecting the current sink generating part of the circuit in a manner differently from the current source generating part of the circuit. One object of the present invention is to provide a current generating circuit in which the source and sink currents remain substantially matched despite process variations.

A common use of a current generating circuit of the type illustrated in FIGS. 1A and 1B to provide several current sinks and/or sources. To do this, separate sets of transistors corresponding to Q9,Q10 for the current source and Q11, Q12 for the current sink are connected in parallel to provide separate current generating arrangements. Taking the current sink generating part of the circuit as an example, consider n sets of transistors connected in parallel with Q11,Q12, each having the same size as Q11,Q12. The base current required to drive the output transistors is nIb where Ib is the base current supplied to the base of each of the transistors Q11,Q12. This base current is derived from the collector current of Q5 and Q8 respectively. For a single set of output transistors, the assumption is made that the base current is very small compared to the collector current and so does not significantly affect the operation of the current mirror circuits. However, if a significant number of extra sets of transistors are connected to supply a plurality of current sinks, the amount of base current required to be supplied increases to such an extent that it does affect the collector currents in the current mirror circuits and thus the reference current and also affects the matching of the sink and source currents. The ability to drive these sets of transistors without the reference current being adversely affected is called the fan-out capability of the circuit.

FIGS. 1A and 1B illustrate the magnitude of the currents flowing in each branch of the circuit, where n is the number of sets of output transistors, Ibp is the base current for a p-type transistor and Ibn is the base current for an n-type transistor. Thus $$Isource=n\ [I-(2n+5)Ibp+nIbn]$$

$$Isink=n\ [I-(2n+5)Ibp-2Ibn]$$

Hence the mismatch current Imismatch=Isource−Isink=n [nIbn+2Ibn]=n(n+2)Ibn and thus depends on both n and Ibn. With the circuit of FIGS. 1A and 1B therefore, there will always be a mismatch current, and this will increase as n increases.

The present invention seeks to provide a circuit which overcomes these problems. Further, the present invention seeks to provide a circuit which has a high DC power supply rejection ratio and can operate with a low supply voltage (down to 1.4 V).

SUMMARY OF THE INVENTION

According to one aspect of the present invention there is provided a source/sink current generating circuit comprising:

a first set of matched transistors of one type connected as a first current mirror to drive a current source output transistor;

a second set of matched transistors of the opposite type connected as a second current mirror to drive a current sink output transistor, the first and second sets being connected in series between first and second reference voltages;

a current setting load connected to one of the first and second current mirrors for setting the magnitude of source and sink currents to be output respectively from the current source and current sink output transistors; and a biasing transistor having a control node connected in a controllable path common to the first and second current mirrors and a controllable path connected between the first and second current mirrors.

Preferably, the first current mirror includes a third set of matched transistors of said one type connected in cascode with said first set.

Preferably, the second current mirror includes a fourth set of matched transistors of the opposite type connected in cascode with said second set of transistors.

In the described embodiment the first current mirror circuit comprises a first set of bipolar p-n-p transistors with their emitters connected to a supply voltage and their bases connected together. The base of one of the transistors is connected into its collector. The collectors of the first set of transistors are connected to the emitters of the third set of transistors which are also bipolar p-n-p transistors. The third set of transistors have their bases connected together. The collectors of the third set of transistors are connected to the collectors of the fourth set of transistors which are bipolar n-p-n transistors. The bases of the transistors in the fourth set are connected together and the base of one of the transistors is connected to its collector. The second set of transistors are also bipolar n-p-n transistors with their bases connected together. The base of one of the second set of transistors is connected to its collector. The collectors of the second set of transistors are connected to the emitters of the fourth set to form a cascode arrangement. The emitters of the second set are connected to ground, the emitter of one of the transistors of the second set being connected to ground through the current setting load. In the described embodiment, the current setting load is a resistor. In this arrangement, the biasing transistor comprises a bipolar n-p-n transistor having its collector connected to the bases of the transistors in the third set and its emitter connected to the bases of the transistors in the second set. The base of the biasing transistor is connected in the collector connection between the third and fourth sets of transistors.

It will be appreciated that the term "matched transistors" used herein denotes transistors whose collector currents are substantially the same in the same condition.

For a better understanding of the present invention, and to show how the same may be carried into effect, reference will now be made by way of example to the accompanying drawings.

BRIEF DESCRIPTION OF THE DRAWINGS

FIGS. 3A, 3B and 3C are circuit diagrams showing a plurality of output sets;

DESCRIPTION OF THE PREFERRED EMBODIMENT

Figure 1A:
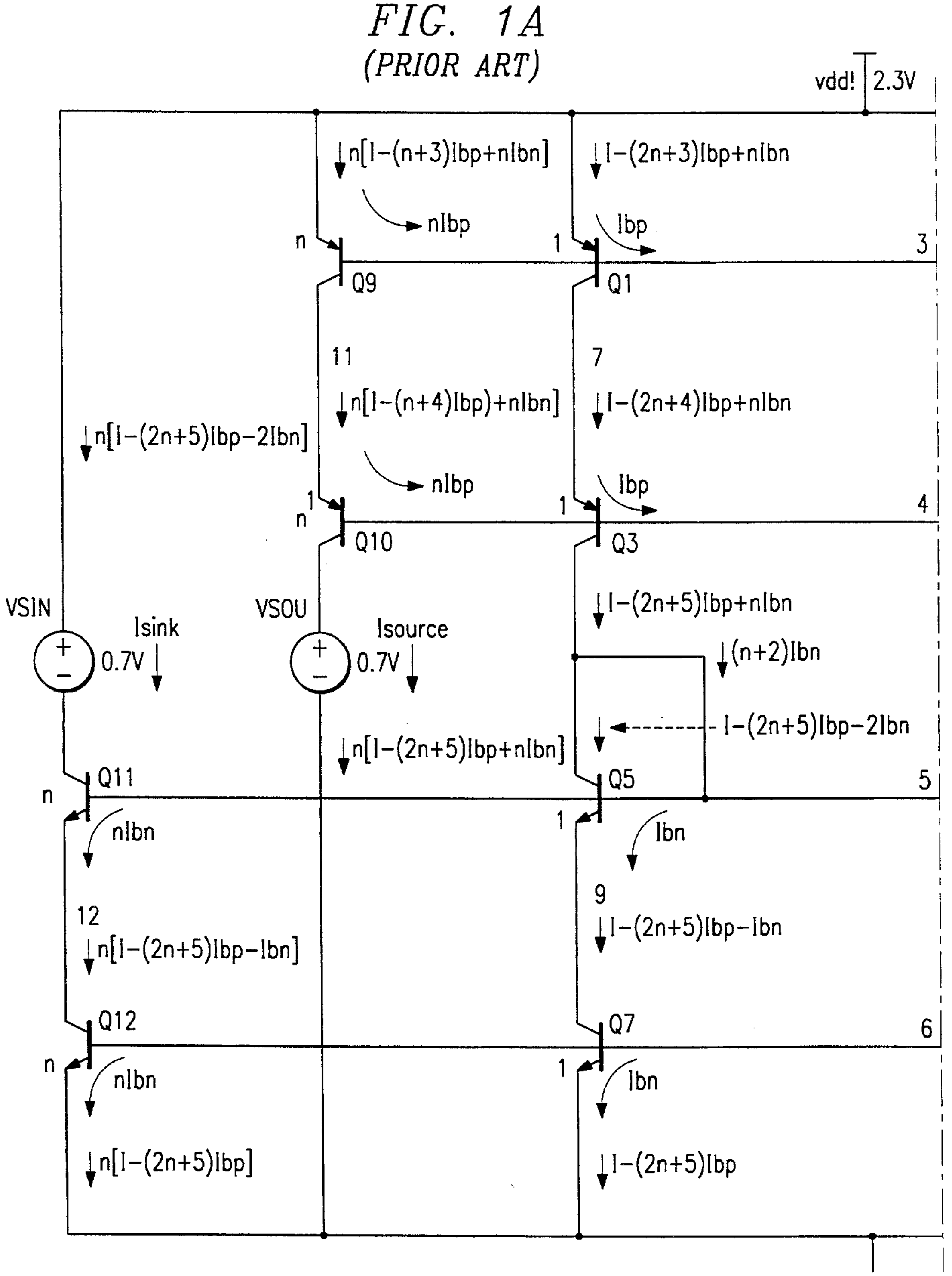
FIG. 1A (PRIOR ART)
FIGS. 1A and 1B is a circuit diagram of a source/sink generating circuit in accordance with the prior art.
Figure 1B:
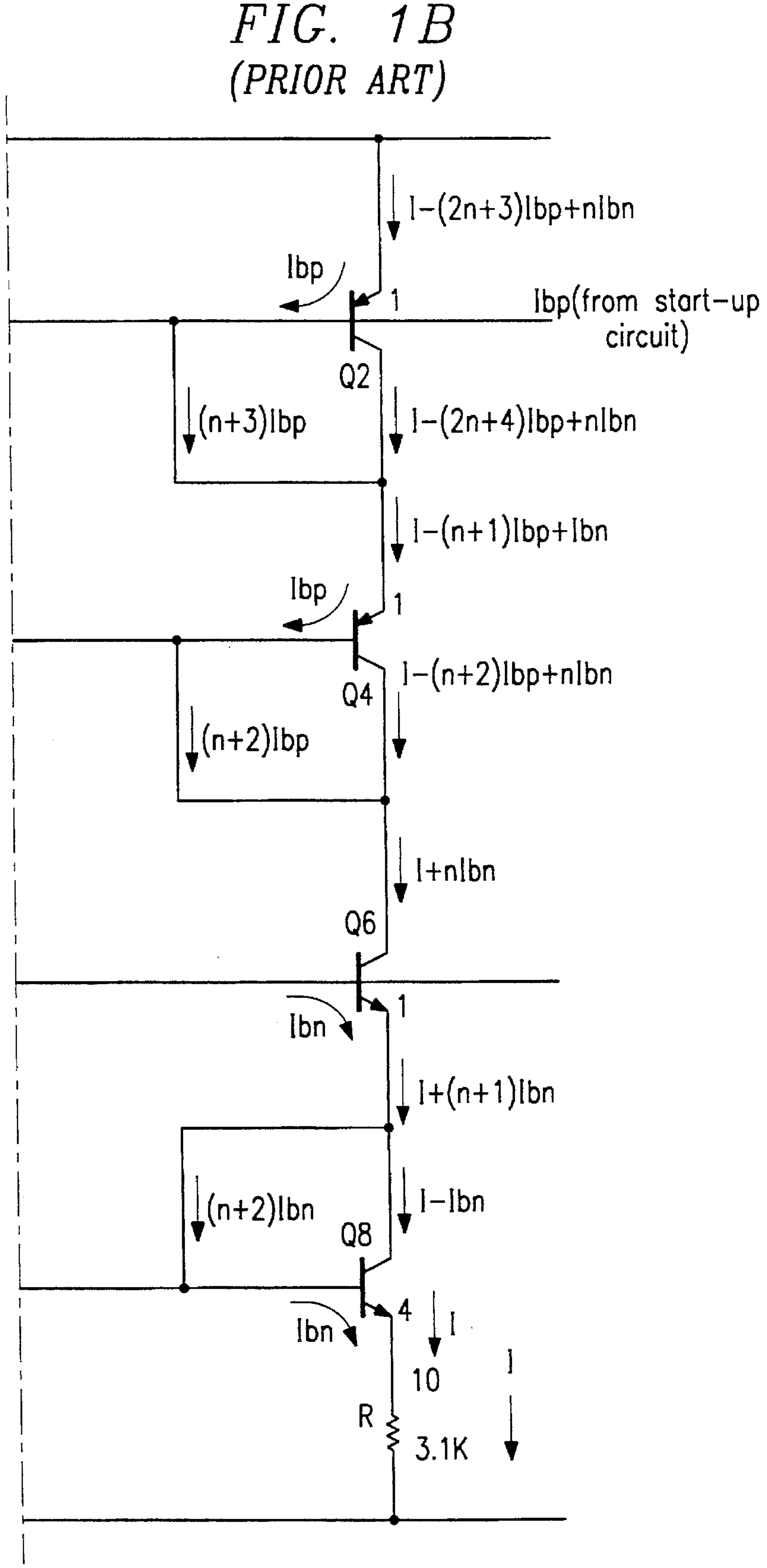
FIG. 1B (PRIOR ART)
Figure 2:
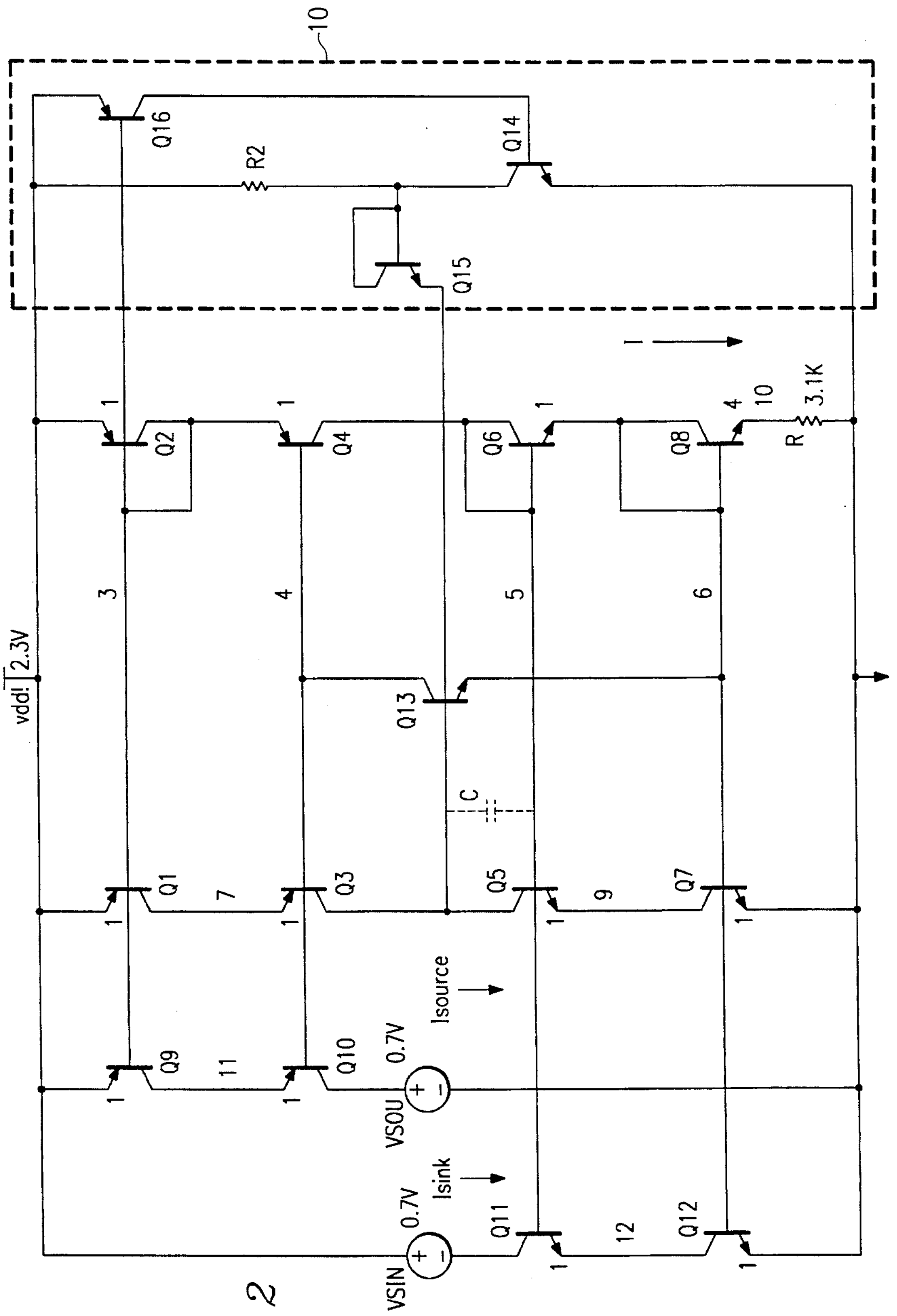
FIG. 2 is a circuit diagram of a current source/sink generating circuit in accordance with one embodiment of the present invention.

FIG. 2 shows a circuit in accordance with one embodiment of the present invention. Insofar as the circuit is the same as that illustrated in FIGS. 1A and 1B common reference numerals denote common transistors. The circuit of FIG. 2 includes an extra n-p-n transistor, Q13, having its base connected to the collector of Q5, its collector connected to the bases of the transistors Q3,Q4 and its emitter connected to the bases of the transistors Q7,Q8. The base of the transistor Q5 is no longer connected to its collector. Instead, the base of the transistor Q6 is connected to the collector of the transistor Q6. In other respects the circuit is the same as that described in FIGS. 1A and 1B. FIG. 2 also shows a suitable start-up circuit which is marked by the dotted line 10. The start-up circuit comprises a p-n-p transistor Q16 having its base connected to the bases of the transistors Q1 and Q2, its emitter connected to the supply voltage Vdd and its collector connected into the base of a further n-p-n transistor Q14. Transistor Q14 has its emitter connected to ground and its collector connected via a resistor R2 to the supply voltage Vdd. A further diode connected transistor Q15 has its base connected between the collector of the transistor Q14 and the resistor R2 and its emitter connected to the base of the additional transistor Q13. The start-up circuit is described for the sake of completeness only. Other start-up circuits can be used with the circuit of the present invention.

A capacitor C may be connected into the circuit between the base of the transistor Q13 and the base of the transistor Q5 for frequency stability.

The transistor Q13 has several important effects. By holding the collector voltage of the transistor Q3 at a value which is fixed above ground (VbeQ7+VbeQ13) this eliminates the so-called "early effect" which renders the source and sink currents generated by the circuit dependent on the supply voltage. This improves considerably the DC power supply rejection ratio for the circuit. The early effect and its elimination is described more completely in our earlier patent application No. 9223338.6 the contents of which are incorporated herein by reference. A corresponding U.S. patent application Ser. No. 08/105,450, is now pending.

The additional transistor Q13 also has the surprising effect that when the source and sink currents are calculated by analysing the current flows throughout the circuit, the formulae for the source and sink currents are as follows:

$$Isource=n*(I-(2n+5)*Ibp+2(n+1)*Ibn)$$

$$Isink=n*(I-(2n+5)*Ibp+2(n+1)*Ibn)$$

where I is the reference current. Hence Imismatch=Isource−Isink =0.

Figure 3A:
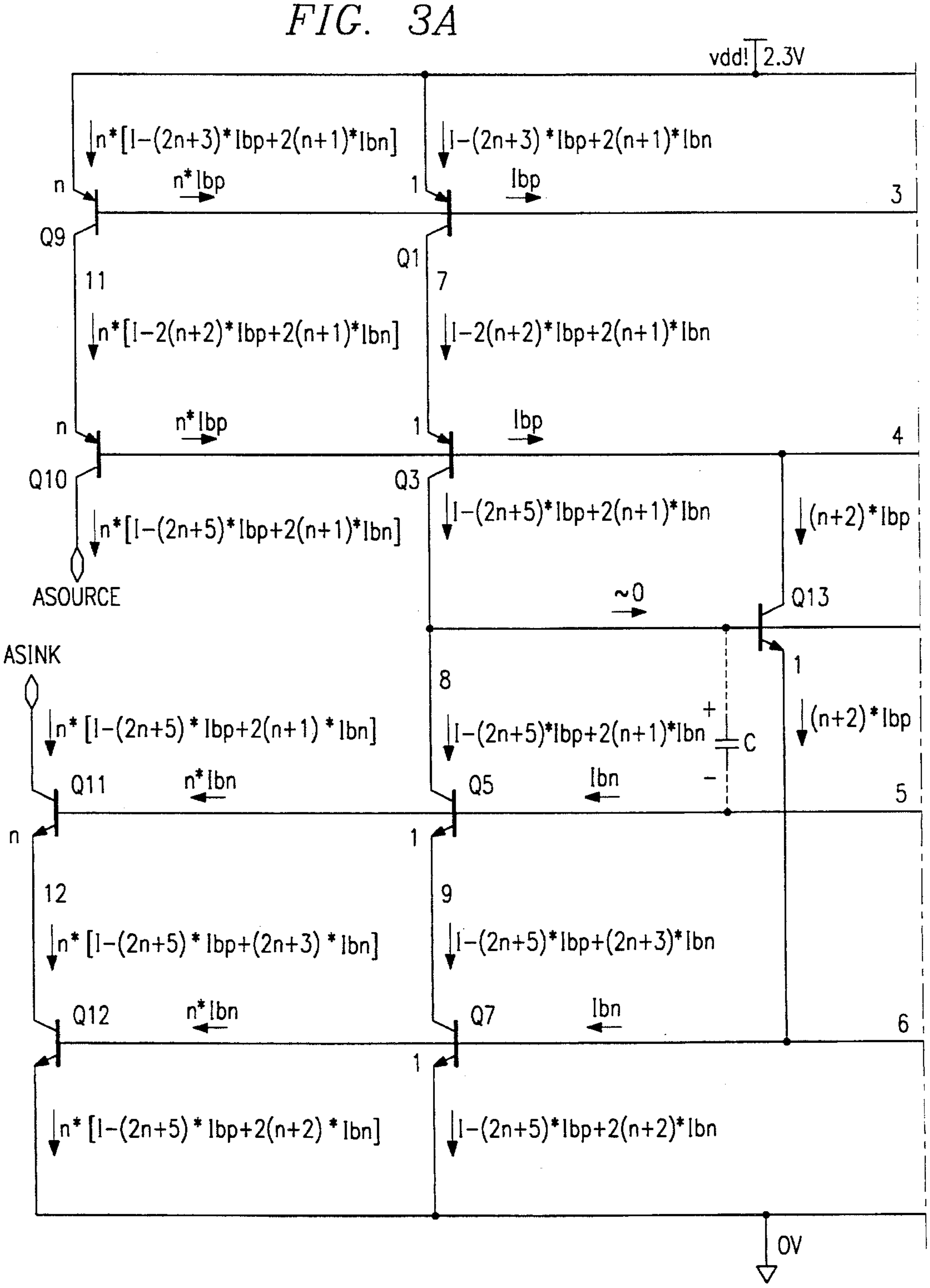
FIGS. 3A, 3B and 3C are the circuit diagrams of FIG. 2 annotated to show the currents in the various branches.
Figure 3B:
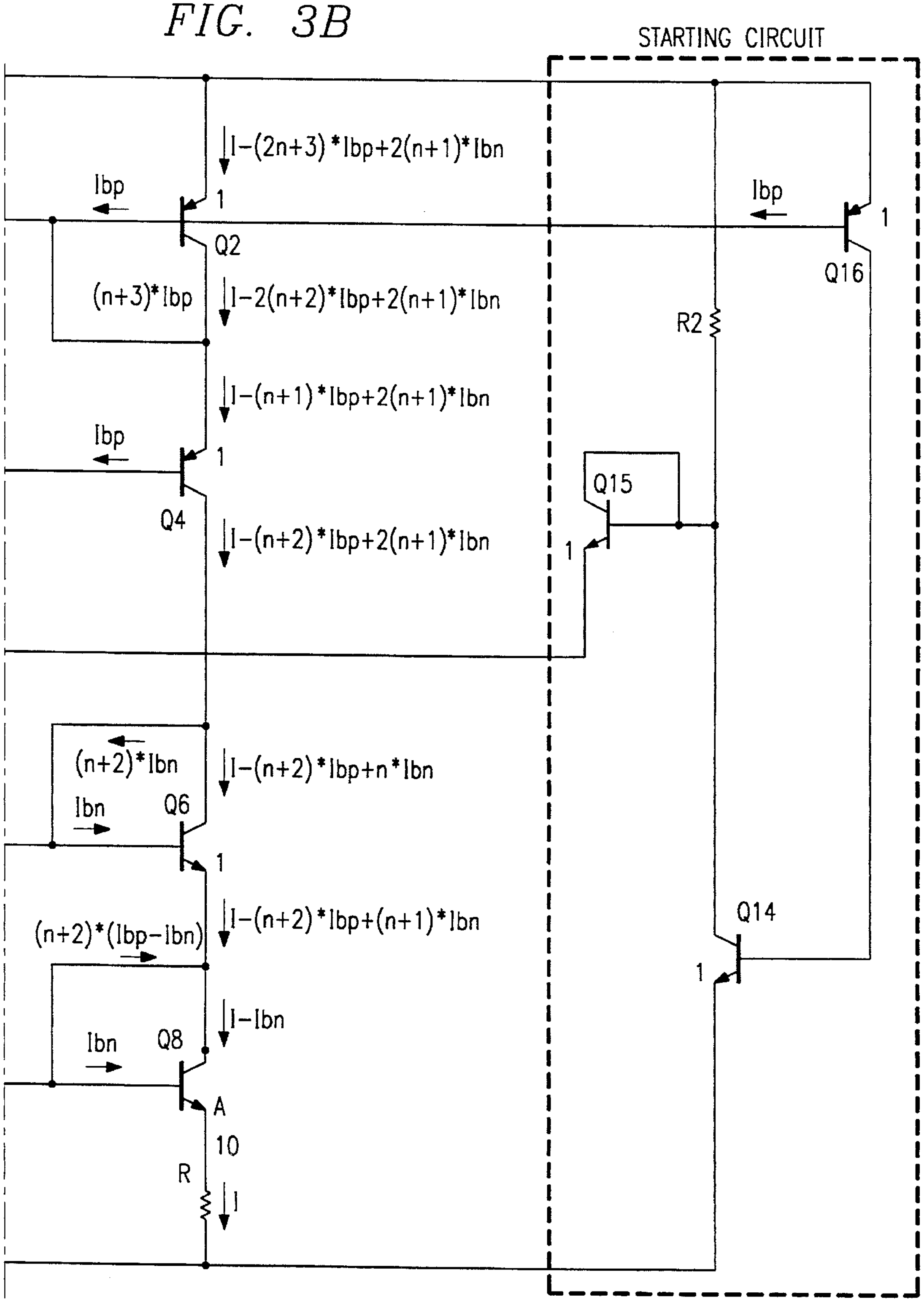
Figure 3C:
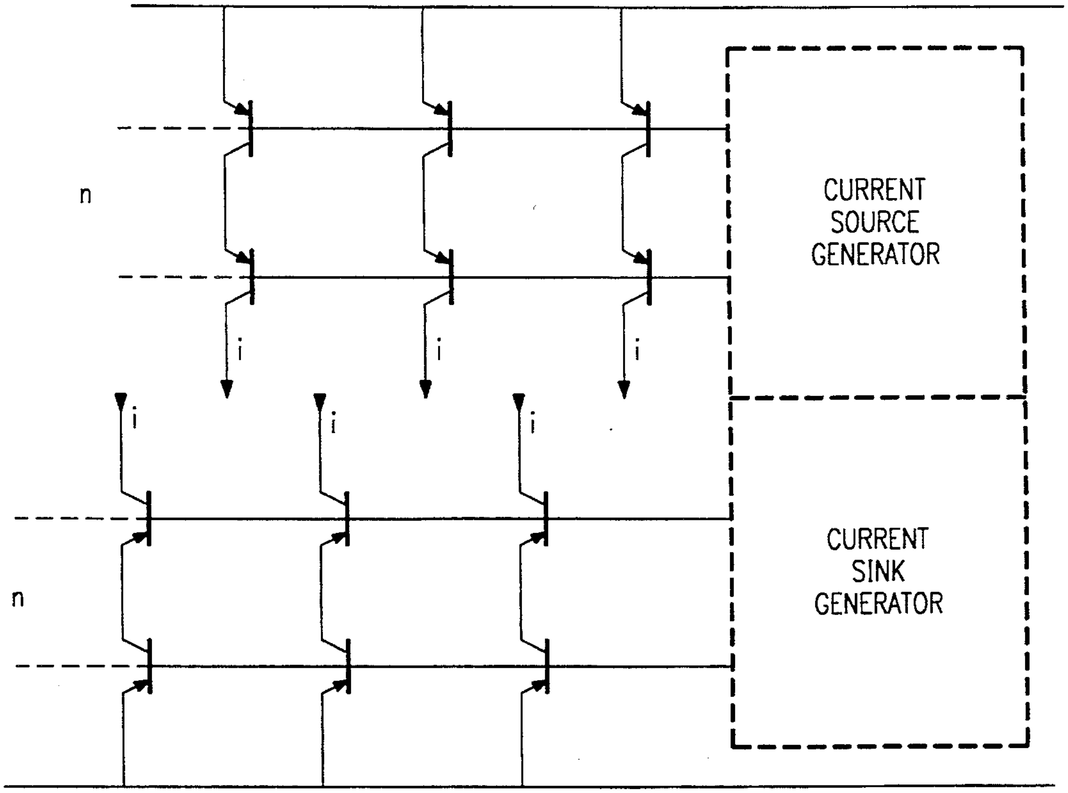

The currents flowing in each branch of the circuit are illustrated in FIGS. 3A, 3B and 3C. These are derived in each place by applying Kirchoff's laws and the normal equations for n-p-n and p-n-p transistors. The derivation of the current in each part of the circuit is not set forward herein since it is well within the scope of a person skilled in the art.

In the above equations, n is the area ratio between the transistors Q12 and Q7 and between the transistors Q10 and Q3. As the same formula applies for Isource and Isink the circuit is almost entirely insensitive to process variations, even those which affect p-n-p type transistors differently from n-p-n type transistors. Ibp and Ibn are the base currents of p-n-p and n-p-n transistors respectively.

Figure 4:
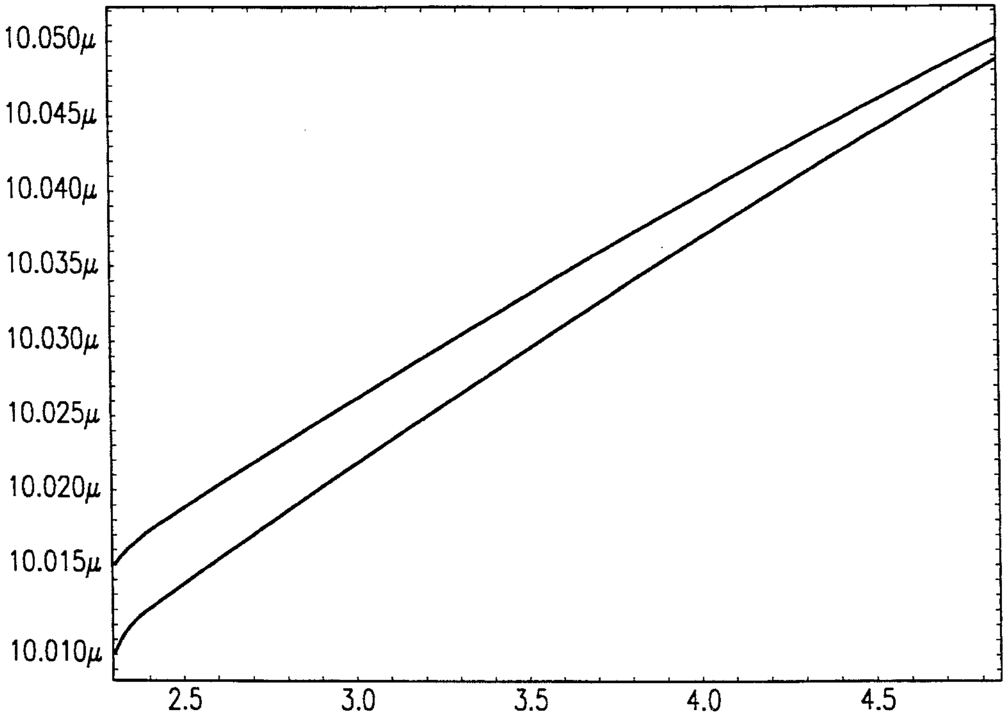
FIG. 4 is a graph of source/sink current versus supply voltage for a circuit in accordance with the present invention.

FIG. 4 is a graph of the current generated in microamps versus the supply voltage for the circuit of FIG. 2 where n=1. The following figures can be deduced from FIG. 4:

1. DC $PSRR$ @ 10 μA nominal ($n=1$)

$$=\frac{10.077\ \mu A-10.009\ \mu A}{7.0\ V-2.3\ V}$$

= 14.5 nA/V or 1450 ppm/V

2. @ $Vdd=2.5$ v,1 = 10 μA, $I$sink = $I$source = 10 μA nominal

PERCENTAGE CURRENT MISMATCH

= ($I$source − $I$sink)/$I$nom * 100%

= (10.018 μA − 10.013 μA)/10 μA * 100%

= 0.05%

Figure 5:
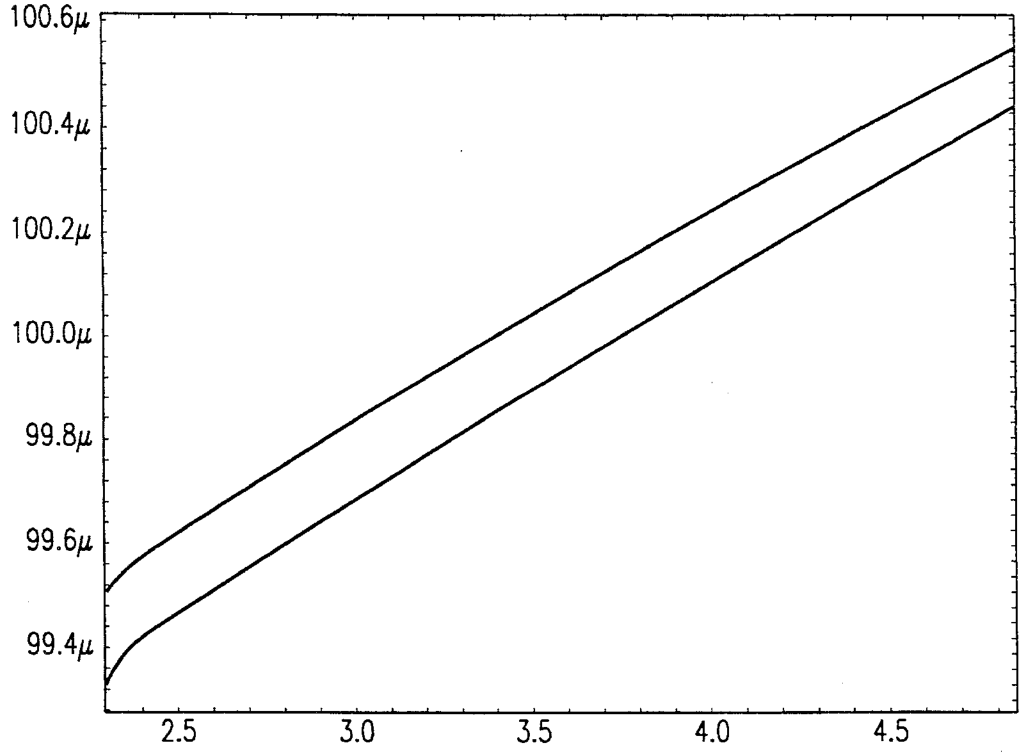
FIG. 5 is a graph of source/sink current versus supply voltage for a circuit in accordance with the present invention having n=10 sets of output transistors.

FIG. 5 is a similar graph for n=10. As explained above, n is the area ratio between Q12 and Q7 and between Q9 and Q1. n can be obtained either by making Q12 n times the size of Q7 to provide a sink current which is ten times the current I set by the current setting resistor R. As an alternative, there could be n sets of output transistors connected in parallel to Q11 and Q12, and, Q9 and Q10, each transistor having the same size and being equal to that of the transistors Q7 and Q3. This is shown in FIGS. 3A, 3B and 3C where the current generating circuit is indicated diagrammatically by the blocks "current sink generator" and "current source generator". In this case, an ideal current generator should be capable of generating the same current I in each set of transistors, the aggregate of the currents nI being equal to n times the current I set by the current setting resistor. The following figures can be derived from the graph of FIG. 5:

1. DC $PSRR$ @ 100 μA nominal ($n=10$)

$$=\frac{100.437\ \mu A-99.322\ \mu A}{7.0\ V-2.3\ V}$$

= 237 nA.V or 2370 ppm

2. @ $Vdd=2.5$ v,$I$ = 10 μA, $I$sink = $I$source = 100 μA nominal

PERCENTAGE CURRENT MISMATCH

= ($I$source − $I$sink)/1nom * 100%

= (99.628 μA − 99.473 μA)/100 μA * 100%

= 0.15%

3. The current nI=99.628 μA against a nominal value of 100 μA

Figure 6:
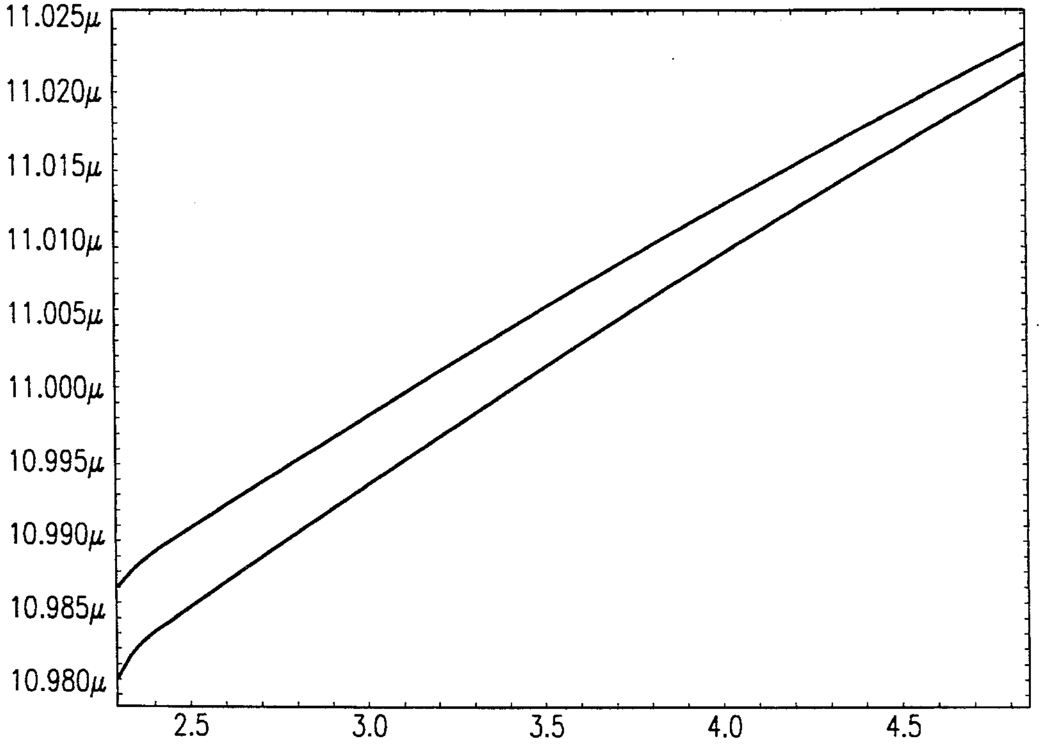
FIG. 6 is a graph of source/sink current versus supply voltage for a circuit according to the invention where the process variations for manufacture have resulted in weak n-p-n transistors and strong p-n-p transistors.

FIG. 6 is a similar graph for the circuit of FIGS. 3A, 3B and 3C which includes weak n-p-n transistors and strong p-n-p transistors, and for n=1. This might occur as a result of severe process variations. The following figures can be derived from the graph of FIG. 6:

1. DC $PSRR$ @ 10 μA nominal $$=\frac{11.021\ \mu A-10.980\ \mu A}{7.0\ V-2.3\ V}$$

= 8.7 nA/V or 790 ppm/V

2. @ $Vdd=2.5$ v,$I$ = 10 μA, $I$sink = $I$source = 10 μA nominal

PERCENTAGE CURRENT MISMATCH

= ($I$source − $I$sink)/$I$nom * 100%

= (10.991 μA − 10.985 μA)11 μA * 100%

= 0.05%

Figure 7:
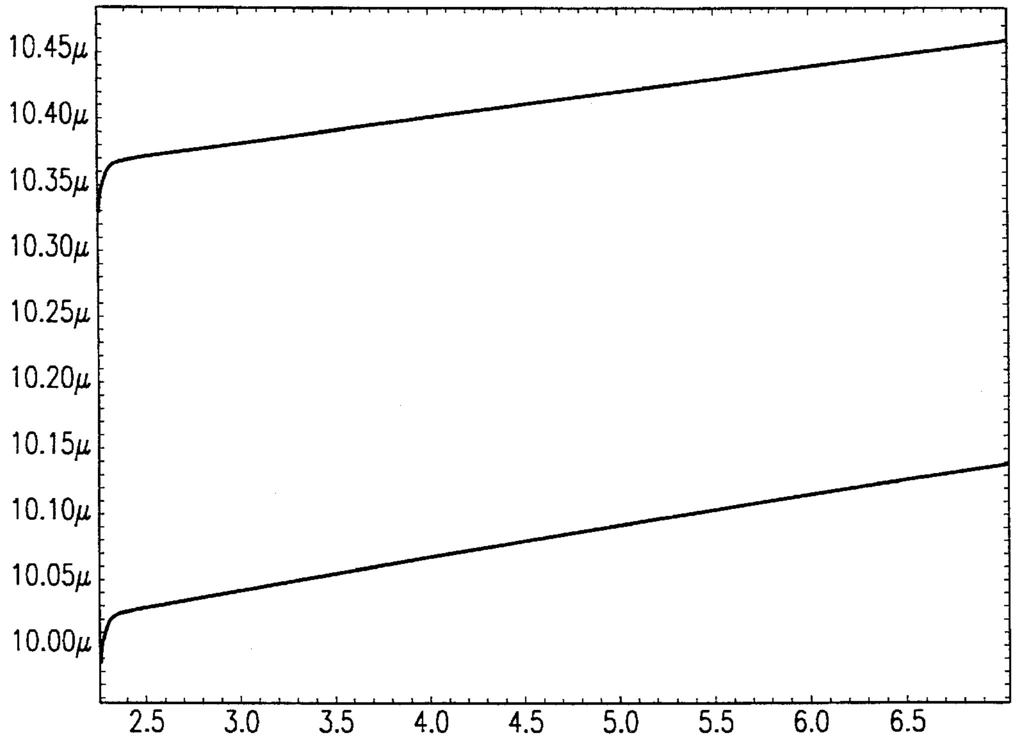
FIG. 7 is a graph of source/sink current versus supply voltage for the prior art circuit of FIGS. 1A and 1B.

FIG. 7 is a graph generated current Vs voltage for the prior art circuit of FIGS. 1A and 1B, n=1, from which the following figures can be derived:

1. DC $PSRR$ @ 10 μA nominal ($n=1$)

$$=\frac{10.130\ \mu A-9.977\ \mu A}{7.0\ V-2.3\ V}$$

= 32.6 nA/V or 3260 ppm/V

2. @ $Vdd=2.5$ v,$I$ = 10 μA, $I$sink = $I$source = 10 μA nominal

PERCENTAGE CURRENT MISMATCH

= ($I$source − $I$sink)/$I$nom * 100%

= (10.367 μA − 10.024 μA)/10 μA * 100%

= 3.43%

The characteristics of the circuit of FIGS. 3A, 3B and 3C thus compare favourably with these figures.

Figure 8:
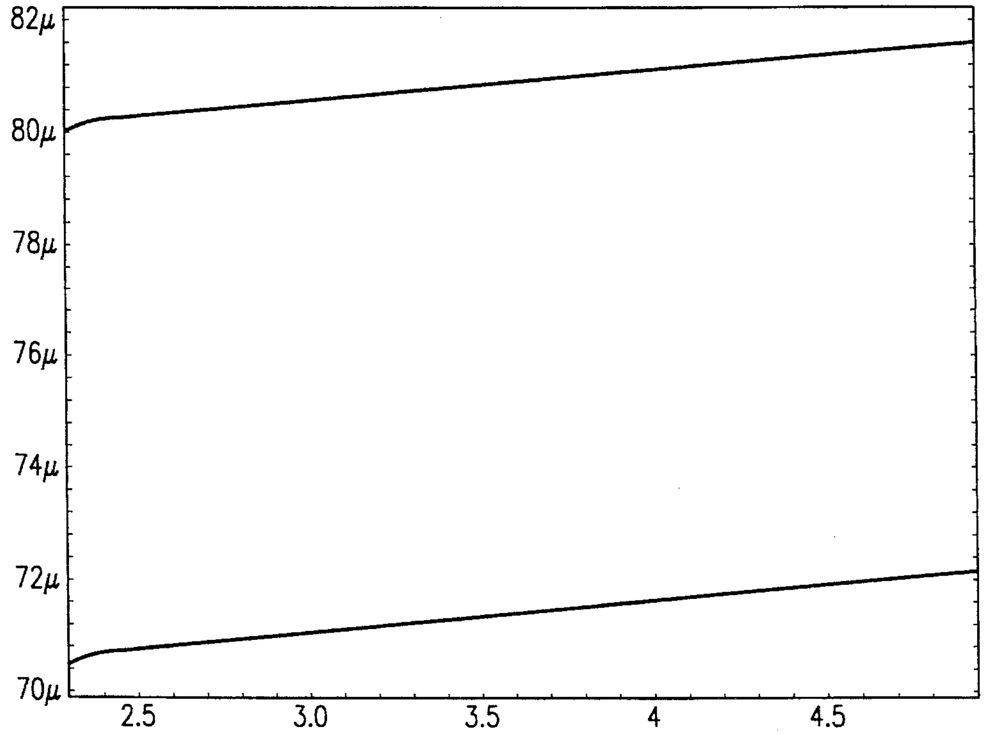
FIG. 8 is a graph of source/sink current versus supply voltage for the prior art circuit of FIG. 1 when connected to n=10 sets of output transistors.

FIG. 8 shows a similar graph for the circuit of FIGS. 1A and 1B which n=10. The following results can be derived:

1. DC $PSRR$ @ 10 μA nominal $$=\frac{72.200\ \mu A-70.402\ \mu A}{7.0\ V-2.3\ V}$$

= 382.5 nA/V or 5464 ppm/V

2. @ $Vdd=2.5$ v,$I$ = 10 μA, $I$sink = $I$source = 100 μA nominal

PERCENTAGE CURRENT MISMATCH

= ($I$source − $I$sink)/$I$nom * 100%

= (80.302 μA − 70.760 μA)/75 μA * 100%

= 12.7%

3. nI=80 μA compared with 100 μA nominal.

FIG. 8 demonstrates that with n=10 the conventional circuit can not produce a current level of 100 μA but could produce only 70 μA to 80 μA. It also has a high mismatch of 12.7%. With the circuit of the present invention however the source and sink current is practically 100 μA respectively as shown in FIG. 5. Thus, the circuit has a high fan-out capability.

What is claimed is:

1. A source/sink current generating circuit, comprising:

a first set of matched transistors of a first conductivity type connected together as a first current mirror to drive a current source output transistor;

a second set of matched transistors of a second conductivity type connected together as a second current mirror to drive a current sink output transistor, said first and second sets of matched transistors being connected in series between first and second supply voltages;

a current setting load connected to one of said first and second current mirrors for setting the magnitude of source current and sink current to be outputted respectively from said current source and current sink output transistors; and a biasing transistor having a control node connected in a controllable path common to said first and second current mirrors and a controllable path connected between said first and second current mirrors.

2. A source/sink current generating circuit according to claim 1, wherein said current setting load is a resistor.

3. A source/sink current generating circuit according to claim 1, wherein said first current mirror comprises a third set of a matched transistors of said first conductivity type connected in cascode with said first set of matched transistors.

4. A source/sink current generating circuit according to claim 1, wherein said second current mirror comprises a fourth set of matched transistors of the second conductivity type connected in cascode with said second set of matched transistors.

5. A source/sink current generating circuit according to claim 3, wherein said biasing transistor comprises a bipolar n-p-n transistor having a collector connected to bases of the transistors in the third set of matched transistors and an emitter connected to bases of the transistors in the second set of matched transistors.

* * * * *